United States Patent
McAvoy et al.

(10) Patent No.: US 7,887,233 B2
(45) Date of Patent: *Feb. 15, 2011

(54) THERMAL BEND ACTUATOR MATERIAL SELECTION

(75) Inventors: Gregory John McAvoy, Balmain (AU); Kia Silverbrook, Balmain (AU)

(73) Assignee: Silverbrook Research Pty Ltd, Balmain, New South Wales (AU)

(*) Notice: Subject to any disclaimer, the term of this patent is extended or adjusted under 35 U.S.C. 154(b) by 0 days.

This patent is subject to a terminal disclaimer.

(21) Appl. No.: 12/572,080

(22) Filed: Oct. 1, 2009

(65) Prior Publication Data

US 2010/0020843 A1    Jan. 28, 2010

Related U.S. Application Data

(63) Continuation of application No. 11/768,875, filed on Jun. 26, 2007, now Pat. No. 7,607,826, which is a continuation of application No. 10/854,269, filed on May 27, 2004, now Pat. No. 7,270,475, which is a continuation of application No. 10/636,259, filed on Aug. 8, 2003, now Pat. No. 6,793,974, which is a continuation of application No. 09/693,079, filed on Oct. 20, 2000, now Pat. No. 7,095,309.

(51) Int. Cl.
  *B32B 9/00* (2006.01)
(52) U.S. Cl. ........................................ 374/44
(58) Field of Classification Search .............. 374/44
    See application file for complete search history.

(56) References Cited

U.S. PATENT DOCUMENTS

| | | | |
|---|---|---|---|
| 4,719,477 A | 1/1988 | Hess | |
| 5,006,421 A | 4/1991 | Yang et al. | |
| 5,409,762 A | 4/1995 | Ozaki et al. | |
| 5,870,007 A | 2/1999 | Carr et al. | |
| 5,870,121 A | 2/1999 | Chan | |
| 5,903,380 A | 5/1999 | Motamedi et al. | |
| 5,917,226 A | 6/1999 | Chan et al. | |
| 6,127,908 A | 10/2000 | Bozler et al. | |
| 6,130,464 A | 10/2000 | Carr | |
| 6,172,346 B1 | 1/2001 | Wroe | |
| 6,188,415 B1 | 2/2001 | Silverbrook | |
| 6,209,989 B1 | 4/2001 | Silverbrook | |
| 6,227,654 B1 | 5/2001 | Silverbrook | |
| 6,247,791 B1 | 6/2001 | Silverbrook | |

(Continued)

FOREIGN PATENT DOCUMENTS

WO    WO 99/03681 A1    1/1999

(Continued)

OTHER PUBLICATIONS

Yang et al "Testing and Characterization of a Bistable Snapping Microactuator based on Thermo-mechanical Analysis" Transducers '95. Eursensors IX, Jun. 1995.

*Primary Examiner*—Archene Turner

(57) ABSTRACT

A thermoelastic device comprising an expansive element is disclosed. The expansive element is formed from a material, which is preselected on the basis that it has one or more of the following properties: a resistivity between 0.1 $\mu\Omega m$ and 10.0 $\mu\Omega m$; chemically inert in air; chemically inert in the chosen ink; and depositable by CVD, sputtering or other thin film deposition technique.

5 Claims, 4 Drawing Sheets

U.S. PATENT DOCUMENTS

| | | |
|---|---|---|
| 6,262,512 B1 | 7/2001 | Mahadevan |
| 6,307,452 B1 | 10/2001 | Sun |
| 6,407,478 B1 | 6/2002 | Wood et al. |
| 6,491,833 B1 | 12/2002 | Silverbrook |
| 6,608,714 B2 | 8/2003 | Hanson et al. |
| 6,679,055 B1 | 1/2004 | Ellis |
| 7,036,312 B2 | 5/2006 | Menard et al. |
| 7,471,184 B1 | 12/2008 | Aksyuk et al. |
| 7,548,145 B2 | 6/2009 | Rubel |
| 2001/0008406 A1 | 7/2001 | Silverbrook |

FOREIGN PATENT DOCUMENTS

| | | |
|---|---|---|
| WO | WO 00/23279 A1 | 4/2000 |
| WO | WO 00/55089 A | 9/2000 |
| WO | WO 00/64805 A | 11/2000 |

THERMAL BEND ACTUATOR MATERIAL SELECTION

CROSS REFERENCE TO RELATED APPLICATIONS

This is a Continuation of U.S. application Ser. No. 11/768,875 filed on Jun. 26, 2007, which is a Continuation of U.S. application Ser. No. 10/854,269 filed on May 27, 2004, now issued U.S. Pat. No. 7,270,475 which is a Continuation of U.S. application Ser. No. 10/636,259 filed on Aug. 8, 2003 now issued U.S. Pat. No. 6,793,974, which is a Continuation of U.S. application Ser. No. 09/693,079 filed on Oct. 20, 2000, now issued U.S. Pat. No. 7,095,309 all of which are herein incorporated by reference.

CO-PENDING APPLICATIONS

Various methods, systems and apparatus relating to the present invention are disclosed in the following co-pending applications filed by the applicant or assignee of the present invention on May 23, 2000:

| | | | | |
|---|---|---|---|---|
| 6,428,133 | 6,526,658 | 6,315,399 | 6,338,548 | 6,540,319 |
| 6,328,431 | 6,328,425 | 6,991,320 | 6,383,833 | 6,464,332 |
| 6,390,591 | 7,018,016 | 6,328,417 | 6,322,194 | 6,382,779 |
| 6,629,745 | 09/575,197 | 7,079,712 | 6,825,945 | 7,330,974 |
| 6,813,039 | 6,987,506 | 7,038,797 | 6,980,318 | 6,816,274 |
| 7,102,772 | 7,350,236 | 6,681,045 | 6,728,000 | 7,173,722 |
| 7,088,459 | 09/575,181 | 7,068,382 | 7,062,651 | 6,789,194 |
| 6,789,191 | 6,644,642 | 6,502,614 | 6,622,999 | 6,669,385 |
| 6,549,935 | 6,987,573 | 6,727,996 | 6,591,884 | 6,439,706 |
| 6,760,119 | 7,295,332 | 6,290,349 | 6,428,155 | 6,785,016 |
| 6,870,966 | 6,822,639 | 6,737,591 | 7,055,739 | 7,233,320 |
| 6,830,196 | 6,832,717 | 6,957,768 | 7,456,820 | 7,170,499 |
| 7,106,888 | 7,123,239 | 6,409,323 | 6,281,912 | 6,604,810 |
| 6,318,920 | 6,488,422 | 6,795,215 | 7,154,638 | 6,859,289 |
| 6,924,907 | 6,712,452 | 6,416,160 | 6,238,043 | 6,958,826 |
| 6,812,972 | 6,553,459 | 6,967,741 | 6,956,669 | 6,903,766 |
| 6,804,026 | 7,259,889 | 6,975,429 | | |

The disclosures of these co-pending applications are incorporated herein by cross reference.

FIELD OF THE INVENTION

The present invention relates to materials potentially suitable for use as the expansive element in thermoelastic design and to methods for ranking the potential relative suitabilities of those materials.

The invention as developed originally as a means of identifying and ranking a range of materials that potentially may exhibit superior properties for use in the manufacture of microscopic thermal bend actuators for use in micro-electro mechanical systems (MEMS), and will be described hereinafter with reference to this field. However, it will be appreciated that the invention is not limited to this particular use and is equally applicable to macroscopic design even though the overall design considerations are vastly different and certainly less complex.

BACKGROUND OF THE INVENTION

It is important to clarify that thermoelastic actuation is characterized using force, deflection and temperature as opposed to switching, which is characterized using deflection and temperature rise alone. Macroscopic thermoelastic actuators are typically used as switches that activate other more energy efficient actuation systems, however, microscopic thermoelastic actuators are an attractive actuation mechanism for a number of reasons. This includes the down scaling of certain physical phenomena. For example, it is possible to fabricate very thin films that decrease the thermal mass and minimize efficiency losses. Opposing gravitational and inertial forces become negligible on the microscopic scale. Other advantages include ease of fabrication (although more complex than simple electrostatic actuators) and the possibility of low voltage operation. Disadvantages include a low operational bandwidth determined by the thermal conductivities of substrate materials—this is more of an advantage for the current application allowing for rapid firing.

A relatively diverse range of output force and deflection values can be obtained by altering actuator geometry. However, the fundamental operation of actuation is directly related to the mechanical and thermal properties of the component materials. Correct material selection in association with effective design can result in either a smaller or a more efficient actuator. Such an actuator increases wafer yield and is thus more commercially viable. A more efficient actuator may be battery powered increasing operation simplicity and negating the requirement for expensive voltage transformers. An increase in thermal efficiency improves the operational firing frequency, and decreases the possibility of thermal crosstalk. This is especially relevant for arrays of thermal actuators in a micro-cilia device.

However, material selection for MEMS application is not straightforward. Firstly, published thin film properties can vary greatly due to different fabrication methods and difficulties associated with experimentally quantifying material properties on the microscopic scale. Secondly, certain thin films can only be fabricated with certain layer thicknesses because inherent stress can shatter or curl the substrate wafer. Thirdly, only certain materials can be used in the fabrication process at most fabs as the introduction of a new material can contaminate machinery.

Progress to Date

Until recently, the only materials regularly used or considered for use in such applications were polysilicon, single crystal silicon. However, the applicant just previously made the surprising discovery that titanium nitride and titanium boride/diboride exhibited excellent properties relevant to this application.

Realizing the breakthrough this surprising discovery signified, the applicant sought to try and identify possible alternatives in order to provide designers of thermoelastic systems with more choice and flexibility. However, given the lack of available data on their film properties for various materials and the fact that empirical testing with MEMS would be prohibitively expensive, there was clearly a need, or it was at least highly desirable to be able to determine a method of evaluating materials for this use based solely on the commonly available macro material properties.

SUMMARY OF THE INVENTION

It is therefore an ultimate object of one aspect of this invention to identify a range of alternative materials that will potentially exhibit superior properties for use in thermoelastic design and of another aspect to provide a means of ranking the potential suitability of a given range of materials for this same use.

According to an aspect of the invention there is provided a method for selecting a material for a thermal bend actuator of a printhead nozzlel, the method including the steps of:

selecting the material from the group including suicides and carbides of titanium; borides, suicides, carbides and nitrides of tantalum, molybdenum, niobium, chromium, tungsten, vanadium, and zirconium; and selecting the material on the basis of $\epsilon$, wherein $\epsilon$ is a dimensionless constant for the material in accordance with the formula $$\varepsilon = \frac{E\gamma^2 T}{\rho C}$$

wherein E is Young's module of the material; $\gamma$ is the coefficient of thermal expansion; T is the maximum operating temperature, $\rho$ is the density and C is the specific heat capacity.

Other aspects are also disclosed.

BRIEF DESCRIPTION OF THE DRAWINGS

Derivation of the dimensionless constant $\epsilon$ of the first aspect of the invention, together with sample applications and examples of derived values of this constant and other properties for a range of materials, will now be described in detail with reference to the accompanying drawings in which.

DETAILED DESCRIPTION

A non-dimensionalized material actuation efficiency is presented that assesses the potential application of a material to thermoelastic design. The method is based on the material thermal and mechanical properties and assists in a structured approach of material selection for effective design.

The Material Actuation Efficiency

Actuators are characterized by a combination of deflection, force and operation temperature in contrast to switches that are characterized by operation temperature and deflection alone. Fundamental thermoelastic design is characterized by the differential longitudinal expansion of two bonded layers. Thus, the expansion of isolated unbonded layers directly relates to global behavior. A single material beam is used here to illustrate the material actuation efficiency. The approach is straightforward and relates to general thermoelastic design. The derivation assumes that material properties are constant across the thermal range.

Figure 1:
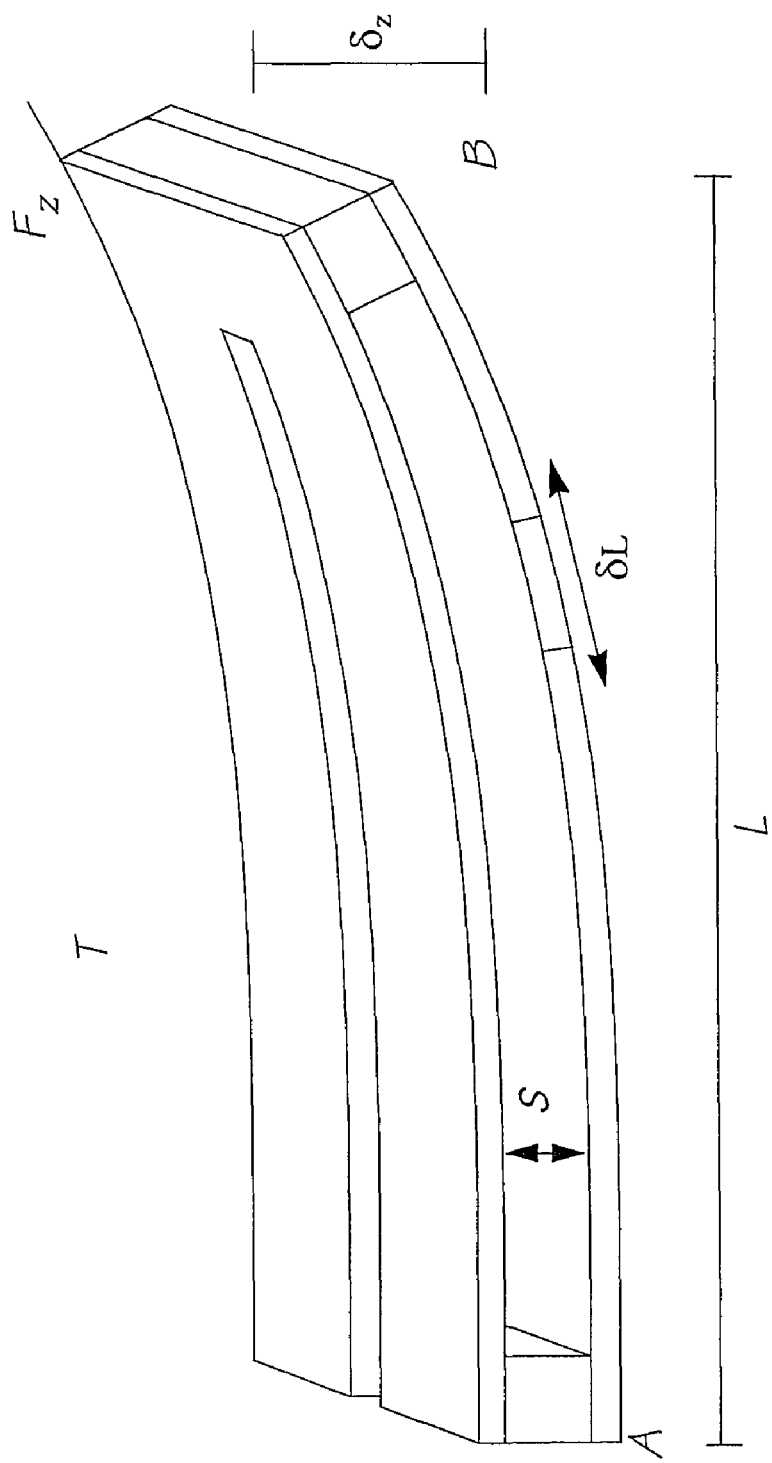
FIG. 1 shows a schematic representation of a thermoelastic actuator.
Figure 2:
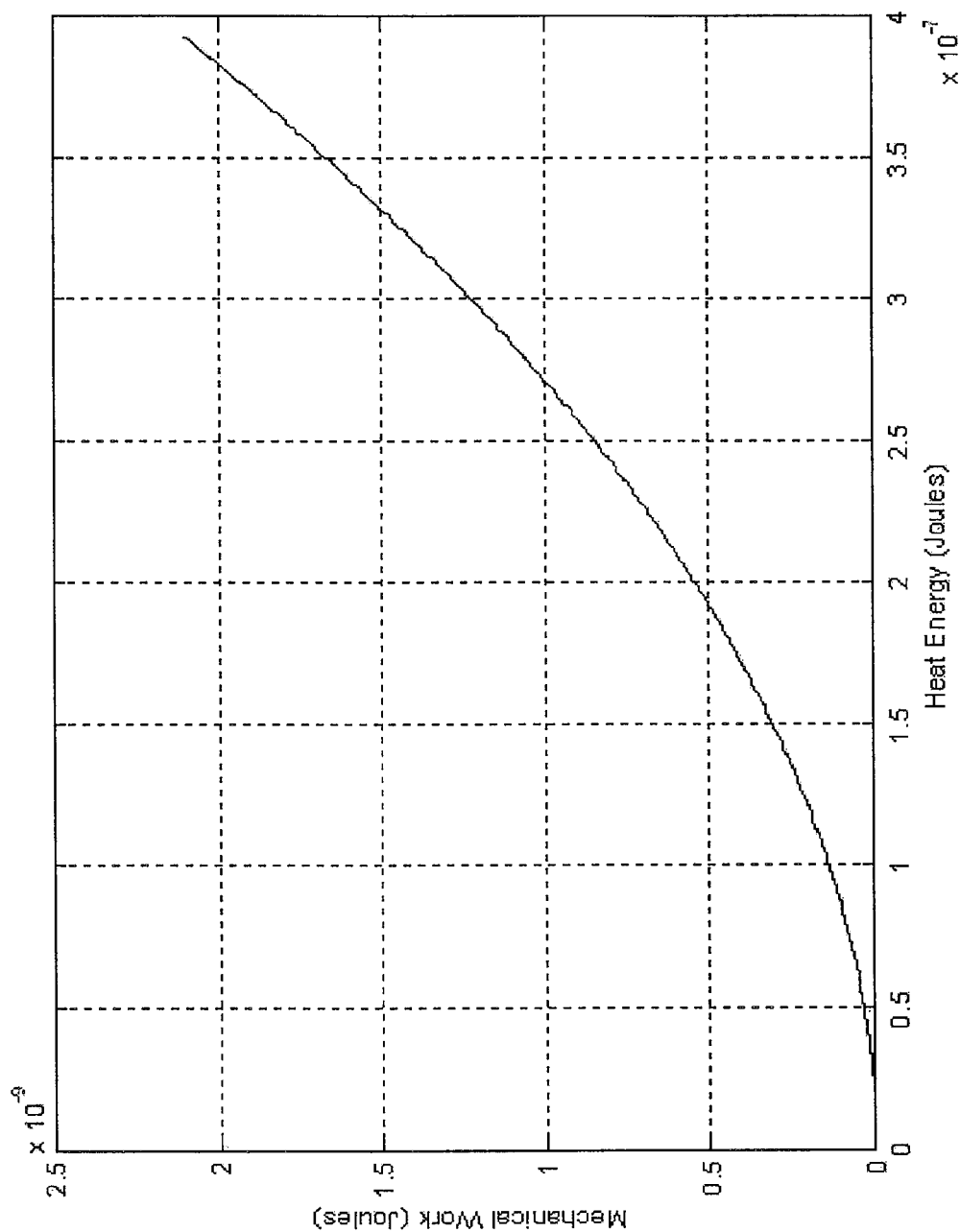
FIG. 2 shows a plot of longitudinal work versus heat energy for single material clamped/free titanium beam (length 20 μm, thickness 1 μm, width 5 μm)

Equations 1 to 3 are fundamental thermomechanical equations describing the behavior of simple single material beam subjected to a quantity of heat, Q as illustrated in FIG. 1. Equation 1 describes the extension, $\delta L$, of a free/free beam and equation 2 describes the reaction force, F, of a clamped/ clamped beam.

$$\delta L = \gamma L_0 T \tag{EQ1}$$

Where: $\delta L$=extension of beam, $L_0$=original length of beam, T=operation temperature (temperature rise), and $\gamma$=coefficient of thermal expansion of beam.

$$F = AE\gamma T \tag{EQ2}$$

F=force exerted by beam expansion, A=cross sectional area of beam, E=Young's Modulus.

$$Q = V\rho Ct \tag{EQ3}$$

Where: Q=heat energy input, V=volume of beam, $\rho$=density, and C=specific heat capacity of beam.

Potential mechanical work is given by equation 4 and is defined as the product of the clamped beam force, F, and free beam deflection, $\delta L$. The quadratic relationship between the heat input and output mechanical work for the simple monolithic beam is shown in FIG. 18.

$$W = F\delta L \tag{EQ4}$$

Where: W=mechanical work

Figure 3:
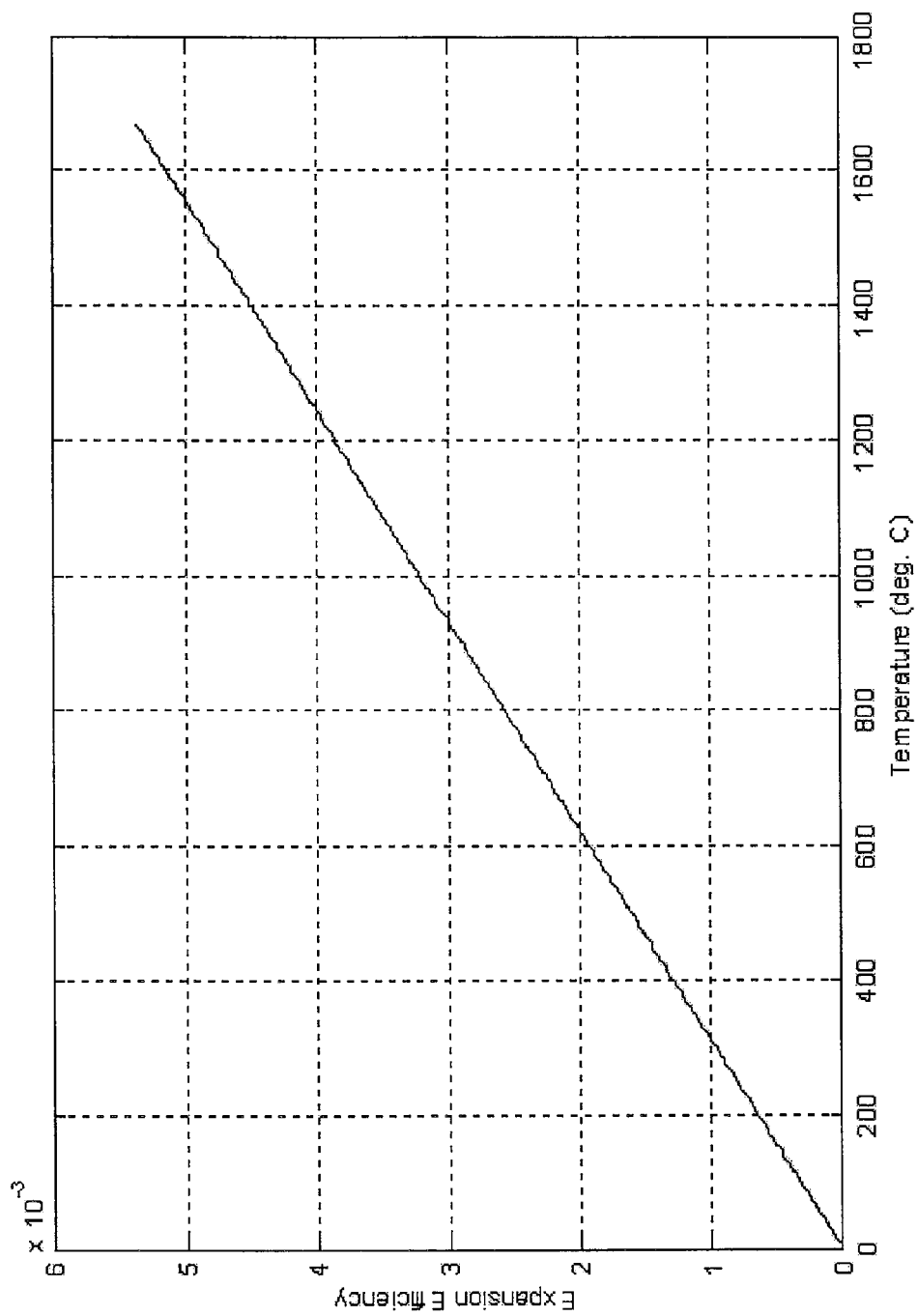
FIG. 3 shows a plot derived from FIG. 2 of expansion efficiency versus temperature efficiency for a clamped/free titanium beam.

Equation 5 describes the non-dimensional thermoelastic actuation efficiency and is formulated as the quotient of the mechanical work and heat energy as described by equations 3 and 4. The efficiency is independent of geometry and is a primary indication of a material's potential application to thermoelastic design. The linear relationship between the actuation efficiency and material temperature for the simple beam is shown in FIG. 3. The graph indicates that high temperature operation is desirable for maximum efficiency. The plot is limited by the applicable operation temperature and therefore, different material plots are of different lengths. The assumption used in this text is that the operation temperature is the material melting point because it is indicative of the operable thermal range. Thus, the material actuation efficiency, $\epsilon$, is defined as the actuation efficiency at the maximum operable temperature, T, of that material. The slope of the efficiency curve is a constant, $m_\epsilon$ and is defined in equation 6. The combination of $\epsilon$ and $m_\epsilon$ fully characterize a materials actuation characteristics non graphically.

$$\varepsilon = \frac{\text{Output Mechanical Work}}{\text{Heat Energy Input}} \tag{EQ5}$$

$$= \frac{E\gamma^2 T}{\rho C}\left[\frac{(\text{N/m}^2)(1/^\circ \text{C.}^2)(^\circ \text{C.})}{(\text{kg/m}^3)(\text{Nm/kg}^\circ \text{C.})}\right]$$

$$m_\varepsilon = \frac{d\varepsilon}{dT} = \frac{E\gamma^2}{\rho C}\left[\frac{\text{N/m}^2 1/^\circ \text{C.}^2}{\text{kg/m}^3 \text{Nm/kg}^\circ \text{C.}}\right] \tag{EQ6}$$

Material Selection

Different thin film materials including materials with extreme properties (PTFE—high g, Diamond—high E) and compounds from all the major CVD groups including borides, silicides, nitrides and carbides is shown in Table 2. The efficiency values are scaled according to silicon efficiency values because the inclusion of scaled values greatly simplifies design equations described in the following text. The scaling or comparison of a material with respect to a reference material is an integral step in the material selection process. In addition, scaling also results in a more readable index as illustrated by the following comparisons. Silicon is chosen as the reference material because of its predominance in lithographic fabrication.

Preliminary candidates for thermoelastic actuation can be selected according to efficiencies and slopes, however, it is important to note that two materials that have identical $\epsilon$ but differing $m_\epsilon$ will output different amounts of work for any constant geometry (see Comparison 1 below, different amounts of heat energy are also required). Three important design parameters are defined here as heat input, work output and volume. A design matrix can be constructed by varying each parameter and can then be used to select suitable materials. The following comparisons are used to assemble the design matrix.

Comparison 1 calculates the maximum possible relative work and associated relative heat input required due to a direct material substitution. Details of the comparison for different materials are included in Table 3 which shows that CVD ceramics are far superior actuator materials than silicon (Table 3 is formulated using melting point and Table 4 is formulated using oxidation temperature). Titanium nitride can output 159.3 times more the amount of mechanical work

TABLE 2

Material Properties.

| Material | $g$ $10^{-6}/$ °C. | E GPa | r kg/m³ | C J/ kg °C. | $m_\epsilon/m_{r,e}$ °C.$^{-1}$ | O.T °C. | M.P. °C. | MN O.T. | MN M.P. | KXX W/m·K | R mWm |
|---|---|---|---|---|---|---|---|---|---|---|---|
| Aluminum | 23.1 | 68.9 | 2700 | 897 | 17.12 | | 657 | | 7.98 | 231 | 0.027 |
| Boron Carbide | 4.5 | 454 | 2520 | 955 | 4.31 | | 2450 | | 7.49 | 35 | 5e4 |
| Chromium diBoride | 11.1 | 540 | 5600 | 690 | 19.42 | 1000 | 2150 | 13.78 | 29.62 | 32 | 0.18 |
| Chromium diSilicide | 5.9 | | 5600 | | | 1150 | 1560 | | | | 0.8 |
| Chromium Carbide | 9.9 | 385 | 6680 | 530 | 12.02 | 1100 | 1895 | 9.38 | 16.16 | 19 | 0.75 |
| Chromium Oxide | 9.0 | 102 | 5210 | 730 | 2.45 | 1000 | 2603 | 1.74 | 4.52 | 30 | 13 |
| Copper | 16.5 | 110 | 8940 | 386 | 9.79 | | 1085 | | 7.53 | 398 | 0.017 |
| Gold | 14.2 | 80 | 19300 | 129 | 7.31 | | 1064 | | 5.52 | 315 | 0.023 |
| Hafnium Carbide | 6.3 | 410 | 12670 | 190 | 7.63 | 600 | 3930 | 3.24 | 21.25 | 13 | 0.4-0.6 |
| Hafnium diBoride | 7.6 | | 11200 | 300 | | 1500 | 3250 | | | 51 | 0.1 |
| Hafnium diSilicide | | | 8030 | | | 1100 | 1700 | | | | |
| Hafnium Monocarbide | 6.5 | 424 | 11940 | | | | 3890 | | | 8 | 0.5 |
| Hafnium Nitride | 6.5 | | 13,940 | | | 500 | 3300 | | | 17 | 32 |
| Molybdenum | 4.8 | 343 | 10200 | 251 | 3.48 | | 2623 | | 6.48 | 138 | |
| Molybdenum Boride | 5 | 685 | 7480 | 530 | 4.87 | 1000 | 2140 | 3.46 | 7.40 | 27 | 0.18 |
| Molybdenum Carbide | 6.7 | 530 | 9120 | 315 | 9.34 | 500 | 2500 | 3.31 | 16.56 | 22 | 0.57 |
| Molybdenum diSilicide | 8.4 | 450 | 6240 | 550 | 10.44 | 1700 | 2050 | 12.58 | 15.17 | 49 | 0.7 |
| Nickel | 13.4 | 200 | 8900 | 444 | 10.25 | | 1455 | | 10.58 | 90.7 | |
| Niobium diBoride | 8.6 | 650 | 7210 | 420 | 17.91 | 850 | 3000 | 10.80 | 38.10 | 0.12 | 17 |
| Niobium diSilicide | 8.5 | | 5690 | | | 900 | 2050 | | | | 0.5 |
| Niobium Carbide | 7.4 | 450 | 7820 | 290 | 12.26 | 650 | 3500 | 5.65 | 30.42 | 14 | 0.19 |
| PTFE | 220 | 1.3 | 2130 | 1024 | 32.54 | | 200 | | 4.62 | 140 | 10e22 |
| Silicon | 3.0 | 162 | 2330 | 705 | 1.00 | 1410 | 1410 | 1 | 1 | 149 | 2300 |
| Silicon Carbide | 4.7 | 304 | 3440 | 669 | 3.29 | | 2700 | | 6.30 | 90 | 0.5 |
| Tantalum Carbide | 6.7 | 510 | 14500 | 190 | 9.37 | 650 | 3900 | 4.32 | 25.93 | 23 | 0.35 |
| Tantalum diBoride | 8.5 | 250 | 12600 | 250 | 6.47 | 850 | 3090 | 3.90 | 14.17 | 16 | 0.14 |
| Tantalum diSilicide | 9.5 | | 9080 | 360 | | 800 | 2670 | | | | 0.46 |
| Titanium Carbide | 7.4 | 462 | 4920 | 480 | 12.08 | 700 | 3160 | 6.00 | 27.08 | 17.2 | 1.55 |
| Titanium diBoride | 8.2 | 575 | 4450 | 632 | 15.51 | 1400 | 3253 | 15.40 | 35.78 | 26.4 | 0.13 |
| Titanium diSilicide | 10.7 | 270 | 4100 | 480 | 17.72 | 1300 | 1540 | 16.34 | 19.35 | 46 | 0.145 |
| Titanium Nitride | 9.4 | 600 | 5450 | 636 | 17.25 | 500 | 2950 | 6.12 | 36.10 | 30 | 1.35 |
| Tungsten Boride | 5.0 | 790 | 13100 | 460 | 3.70 | 1000 | 2365 | 2.62 | 6.20 | 52 | 0.19 |
| Tungsten Carbide | 5.2 | 690 | 15800 | 200 | 6.66 | 500 | 2780 | 2.36 | 13.13 | 29 | 0.2 |
| Tungsten diSilicide | 7.0 | 300 | 9750 | 330 | 5.15 | 1200 | 2165 | 4.39 | 7.91 | 48 | 33e10 |
| Vanadium diBoride | 7.6 | 260 | 5100 | 670 | 4.96 | 600 | 2430 | 2.11 | 8.54 | 42 | 0.13 |
| Vanadium Carbide | 6.7 | 420 | 5480 | 530 | 7.32 | 600 | 2730 | 3.12 | 14.18 | 10 | 0.59 |
| Vanadium diSilicide | 11.2 | | 5100 | | | 1000 | 1700 | | | 25 | 0.66 |
| Vanadium Nitride | 8.1 | 460 | 6080 | 630 | 8.89 | 450 | 2170 | 2.84 | 13.68 | 5.2 | 0.85 |
| Zirconium Carbide | 6.3 | 410 | 6560 | 250 | 11.19 | 600 | 3440 | 4.76 | 27.31 | 22 | 0.42 |
| Zirconium diBoride | 5.9 | 340 | 6170 | | | 1300 | 3245 | | | 58 | 0.15 |
| Zirconium diSilicide | 8.7 | 270 | 4900 | | | 1150 | 1600 | | | 15 | 0.76 |
| Zirconium Nitride | 5.9 | 500 | 7350 | 400 | 6.68 | 500 | 2950 | 2.37 | 13.97 | 10 | 0.2-0.3 |

Where:
γ = Coefficient of thermal expansion.
E = Young's Modulus,
ρ = density,
C = specific heat capacity,
O.T. = Oxidizing temperature,
M.T. = Melting Temperature,
$m_\epsilon$ = Efficiency Slope (normalized to Silicon $m_\epsilon$ value, normalized Silicon value $m_{(r,\epsilon)}$ = 0.8865e−06),
$\epsilon_c$ = Material Index (normalized to Silicon ε value, normalized Silicon $\epsilon_r$ = 1.25e−03),
KXX = thermal conductivity, and
R = resistivity.

Comparison 1

The mechanical work and heat input between a material and silicon for a constant beam volume is compared. Thus, than silicon with only 4.41 times the amount of heat input. The factor in equation 8 and the scaled material efficiency ratio (as included in Table 2) repeatedly occur in the following comparisons illustrating the versatility of the method.

$$\frac{W_c}{W_r} = \frac{\varepsilon_c Q_c}{\varepsilon_r Q_r} = \frac{\varepsilon_c}{\varepsilon_r}\left(\frac{\rho_c C_c T_c}{\rho_r C_r T_r}\right) \quad \text{(EQ7)}$$

The r subscript denotes the reference material which is silicon in this case. The c subscript denotes the compared material.

$$\frac{Q_c}{Q_r} = \left(\frac{\rho_c C_c T_c}{\rho_r C_r T_r}\right) \quad \text{(EQ8)}$$

Comparison 2

Different materials increase in temperature by different amounts when subjected to the same quantity of heat energy for a constant volume. The material volume is scaled relative to the silicon volume according to the constraints that the same amount of silicon heat energy is input to both actuators and the compared material attains its operational temperature. Thus, the actuation efficiency value remains unchanged because it is not a function of volume and the operable temperature is reached (as equation 5 shows). Comparison 2 represents the design case where heat and volume are critical factors.

The scaled volume and output mechanical work are calculated using equations 9 and 10. The volume change is typically implemented by modifying one geometric dimension, i.e. length, width or thickness. Titanium nitride is capable of 36.1 times the amount of work that silicon is capable with the same heat energy input but with only 0.23 times the volume. Equation 9 is the inverse of equation 8 and equation 10 is simply the scaled efficiency number as included in Table 2.

$$Q_r = V_r \rho_r C_r T_r = Q_c = V_c \rho_c C_c T_c \Rightarrow \frac{V_{(c,Qr)}}{V_r} = \frac{\rho_r C_r T_r}{\rho_c C_c T_c} \quad \text{(EQ 9)}$$

The first entry of the bracketed subscript in these equations refers to the material that the beam is constructed from. The second entry refers to the constraining variable for the described parameter. For example—$W_{(c,Vc)}$=Mechanical work output from beam constructed of compared material with a volume of $V_c$.

$$\frac{W_{(c,Vc)}}{W_{(r,Vr)}} = \frac{\varepsilon_c Q_r}{\varepsilon_r Q_r} = \frac{\varepsilon_c}{\varepsilon_r} \quad \text{(EQ10)}$$

Comparison 3

The output mechanical work resulting from silicon heat energy for constant volume beams is compared. The operation temperature and efficiency value for the compared material changes. However, the new efficiency is easily calculated using a multiplicative ratio of the new and old operation temperatures because of the linear relationship between temperature and efficiency (as shown in FIG. 3). The new operation temperature and work are given by equations 11 and 12. This comparison represents the design case where heat is a critical parameter.

PTFE will melt when subjected to the input silicon heat value. Titanium disilicide outperforms titanium nitride mainly because of the higher computed operating temperature (Table 3).

$$\begin{aligned} Q_r &= V_r \rho_r C_r T_r \\ &= Q_c \\ &= V_c \rho_c C_c T_{(c,Qr)} \Rightarrow T_{(c,Qr)} \\ &= T_r\left(\frac{\rho_r C_r}{\rho_c C_c}\right) \end{aligned} \quad \text{(EQ 11)}$$

$$\frac{W_{(c,Vc)}}{W_{(r,Vr)}} = \frac{\varepsilon_{(c,Qr)} Q_r}{\varepsilon_r Q_r} = \frac{T_{(c,Qr)}\varepsilon_2}{T_c \varepsilon_r} = \left(\frac{\rho_r C_r T_r}{\rho_c C_c T_c}\right)\frac{\varepsilon_c}{\varepsilon_r} \quad \text{(EQ 12)}$$

Comparison 4

The material volume is scaled with respect to the silicon volume according to the constraint that the compared material operation temperature and silicon work are maintained. Thus, if the silicon work value is less then the original work then the volume is scaled down. Otherwise the volume is increased as is the case for PTFE or amorphous Silicon Dioxide. The material actuation efficiency reoccurs in the calculations as an inverse as shown in equation 14

Titanium nitride can output the same amount of work as silicon but with a volume that is less than two orders of magnitude smaller with an input heat energy that is less than an order smaller.

$$W_r = V_r E_r \gamma_r^2 T_r^2 = W_c = V_c E_c \gamma_c^2 T_c^2 \Rightarrow \frac{V_{(c,Wr)}}{V_r} = \frac{E_r \gamma_r^2 T_r^2}{E_c \gamma_c^2 T_c^2} \quad \text{(EQ 13)}$$

$$\frac{Q_{(c,Vc)}}{Q_{(r,Vr)}} = \frac{\varepsilon_r W_r}{\varepsilon_c W_r} = \frac{\varepsilon_r}{\varepsilon_c} \quad \text{(EQ14)}$$

Comparison 5

The input heat energy required to output silicon mechanical work for constant volume beams is compared. The operation temperature and thus efficiency value for the compared material changes. The new efficiency can be calculated in an identical fashion to that described in comparison 3. The operational temperature and heat input values are calculated using equations 15 and 16.

The table shows that titanium disilicide slightly outperforms titanium nitride whereas both PTFE and silicon dioxide will melt. The CVD ceramics are again shown to have the best performance.

$$\begin{aligned} W_r &= V_r E_r \gamma_r^2 T_r^2 \\ &= W_c \\ &= V_c E_c \gamma_c^2 T_c^2 \Rightarrow T_{(c,Wr)} \\ &= \left(\frac{\gamma_r}{\gamma_c}\right)\sqrt{\frac{E_r}{E_c}} \end{aligned} \quad \text{(EQ15)}$$

$$\frac{Q_{(c,Wr)}}{Q_{(r,Wr)}} = \frac{\varepsilon_r W_r}{\varepsilon_{(c,Qr)} W_r} = \frac{\varepsilon_r T_c}{\varepsilon_c T_{(c,Qr)}} = \frac{\varepsilon_r T_c \gamma_c}{\varepsilon_c T_r \gamma_r}\sqrt{\frac{E_c}{E_r}} \quad \text{(EQ16)}$$

TABLE 3

Design comparisons for materials included in Table 2. Comparisons are done using melting point temperature

| | Comparison 1 | | Comparison 2 | | Comparison 3 Constant | | Comparison 4 | | Comparison 5 | |
|---|---|---|---|---|---|---|---|---|---|---|
| | V | | Q | | V, Q | | W | | V, W | |
| | $Q_c/Q_r$ | $W_c/W_r$ | $V_{(c,Qr)}/V_{(r,Qr)}$ | $W_{(c,Vc)}/W_{(r,Vr)}$ | $T_{(c,Qr)}$ | $W_{(c,Qr)}/W_{(r,Qr)}$ | $V_{(c,Wr)}/V_{(r,Vr)}$ | $Q_{(c,Vc)}/Q_{(r,Vr)}$ | $T_{(c,Wr)}$ | $Q_{(c,Wr)}/Q_{(r,Wr)}$ |
| Aluminum | 0.69 | 5.48 | 1.46 | 7.98 | >Tmelt | | 0.183 | 0.125 | 280.79 | 0.29 |
| Boron Carbide | 2.55 | 19.06 | 0.39 | 7.49 | 962.41 | 2.94 | 0.053 | 0.133 | 561.51 | 0.58 |
| Chromium diBoride | 3.59 | 106.23 | 0.28 | 29.62 | 599.41 | 8.26 | 0.009 | 0.0330 | 208.73 | 0.35 |
| Chromium Carbide | 2.90 | 46.80 | 0.35 | 16.16 | 654.20 | 5.58 | 0.021 | 0.062 | 277.16 | 0.42 |
| Chromium Oxide | 4.27 | 19.34 | 0.23 | 4.52 | 608.98 | 1.06 | 0.052 | 0.221 | 592.32 | 0.97 |
| Copper | 1.62 | 12.18 | 0.62 | 7.53 | 671.18 | 4.66 | 0.082 | 0.132 | 311.11 | 0.46 |
| Gold | 1.14 | 6.31 | 0.87 | 5.52 | 930.29 | 4.82 | 0.159 | 0.181 | 423.90 | 0.46 |
| Hafnium Carbide | 4.08 | 86.81 | 0.24 | 21.25 | 962.13 | 5.20 | 0.012 | 0.047 | 422.05 | 0.44 |
| Molybdenum | 2.90 | 18.78 | 0.34 | 6.48 | 904.67 | 2.23 | 0.053 | 0.154 | 605.63 | 0.67 |
| Molybdenum Boride | 3.66 | 27.09 | 0.27 | 7.40 | 584.23 | 2.02 | 0.037 | 0.135 | 411.42 | 0.70 |
| Molybdenum Carbide | 3.10 | 51.36 | 0.32 | 16.56 | 806.23 | 5.34 | 0.019 | 0.061 | 349.05 | 0.43 |
| Molybdenum diSilicide | 3.04 | 46.09 | 0.33 | 15.17 | 674.86 | 4.99 | 0.022 | 0.066 | 302.14 | 0.45 |
| Nickel | 2.48 | 26.26 | 0.40 | 10.58 | 586.13 | 4.26 | 0.038 | 0.095 | 284.10 | 0.48 |
| Niobium diBoride | 3.92 | 149.44 | 0.25 | 38.10 | 764.86 | 9.71 | 0.007 | 0.026 | 245.55 | 0.32 |
| Niobium Carbide | 3.43 | 104.26 | 0.29 | 30.42 | 1021.31 | 8.88 | 0.010 | 0.032 | 342.97 | 0.34 |
| PTFE | 0.19 | 0.87 | 5.31 | 4.62 | >Tmelt | | 1.152 | 0.216 | >Tmelt | |
| Silicon | 1.00 | 1.00 | 1.00 | 1 | 1410.00 | 1.00 | 1.000 | 1 | 1410.00 | 1.00 |
| Silicon Carbide | 2.68 | 16.91 | 0.37 | 6.30 | 1006.42 | 2.35 | 0.059 | 0.158 | 657.00 | 0.65 |
| Tantalum Carbide | 4.64 | 120.27 | 0.22 | 25.93 | 840.70 | 5.59 | 0.008 | 0.038 | 355.83 | 0.42 |
| Tantalum diBoride | 4.20 | 59.57 | 0.24 | 14.17 | 735.28 | 3.37 | 0.017 | 0.071 | 400.60 | 0.54 |
| Titanium | 1.70 | 7.27 | 0.59 | 4.28 | 984.12 | 2.52 | 0.138 | 0.234 | 619.87 | 0.63 |
| Titanium diBoride | 3.95 | 141.32 | 0.25 | 35.78 | 823.54 | 9.06 | 0.007 | 0.028 | 273.81 | 0.33 |
| Titanium diSilicide | 1.31 | 25..32 | 0.76 | 19.35 | 1176.90 | 14.79 | 0.040 | 0.0517 | 306.22 | 0.26 |
| Titanium Nitride | 4.41 | 159.36 | 0.23 | 36.10 | 668.21 | 8.18 | 0.006 | 0.0277 | 233.83 | 0.35 |
| Tungsten Boride | 6.15 | 38.16 | 0.16 | 6.20 | 384.36 | 1.01 | 0.026 | 0.161 | 383.10 | 1.00 |
| Tungsten Carbide | 3.79 | 49.80 | 0.26 | 13.13 | 732.95 | 3.46 | 0.020 | 0.076 | 394.10 | 0.54 |
| Tungsten diSilicide | 3.01 | 23.80 | 0.33 | 7.91 | 719.86 | 2.63 | 0.042 | 0.126 | 444.06 | 0.62 |
| Vanadium diBoride | 3.58 | 30.63 | 0.28 | 8.54 | 677.83 | 2.38 | 0.033 | 0.117 | 439.34 | 0.65 |
| Vanadium Carbide | 3.42 | 48.53 | 0.29 | 14.18 | 797.46 | 4.14 | 0.021 | 0.071 | 392.10 | 0.49 |
| Vanadium Nitride | 3.59 | 49.09 | 0.28 | 13.68 | 604.67 | 3.81 | 0.020 | 0.0731 | 309.91 | 0.51 |
| Zirconium Carbide | 2.44 | 66.51 | 0.41 | 27.31 | 1412.28 | 11.21 | 0.015 | 0.0366 | 422.05 | 0.30 |
| Zirconium Nitride | 3.74 | 52.32 | 0.27 | 13.97 | 787.80 | 3.73 | 0.019 | 0.0716 | 408.09 | 0.52 |

TABLE 4

Design comparisons for material included in Table 2. Comparisons are done using oxidation temperature

| | Comparison 1 | | Comparison 2 | | Comparison 3 Constant | | Comparison 4 | | Comparison 5 | |
|---|---|---|---|---|---|---|---|---|---|---|
| | V | | Q | | V, Q | | W | | V, W | |
| | $Q_c/Q_r$ | $W_c/W_r$ | $V_{(c,Qr)}/V_{(r,Qr)}$ | $W_{(c,Vc)}/W_{(r,Vr)}$ | $T_{(c,Qr)}$ | $W_{(c,Qr)}/W_{(r,Qr)}$ | $V_{(c,Wr)}/V_{(r,Vr)}$ | $Q_{(c,Vc)}/Q_{(r,Vr)}$ | $T_{(c,Wr)}$ | $Q_{(c,Wr)}/Q_{(r,Wr)}$ |
| Vanadium diBoride | 0.885 | 1.864 | 1.13 | 2.10 | >T oxid. | | 0.326 | 0.475 | 439.337 | 0.648 |
| Vanadium Carbide | 0.752 | 2.341 | 1.33 | 3.11 | >T oxid. | | 0.26 | 0.32 | 392.1 | 0.49 |
| Vanadium Nitride | 0.74 | 2.1 | 1.34 | 2.83 | >T oxid. | | 0.289 | 0.353 | 309.9 | 0.513 |
| Zirconium Carbide | 0.425 | 2.02 | 2.35 | 4.75 | >T oxid. | | 0.301 | 0.21 | 422.05 | 0.299 |
| Zirconium Nitride | 0.64 | 1.5 | 1.57 | 2.36 | >T oxid. | | 0.405 | 0.423 | 408.1 | 0.518 |

A Thermoelastic Actuator

A hot arm/cold arm actuator is presented in FIG. 1 to illustrate the results contained in Table 3. Only the steady state solution for a quantity of heat input to the heater is analyzed. The device comprises two identical material layers separated by air and connected to each other at the ends by a thermally non-conductive block. The force/deflection characteristics of the output mechanical power can be tuned by altering the separation between the two layers. A greater separation increases the transverse force but decreases deflection.

Figure 4:
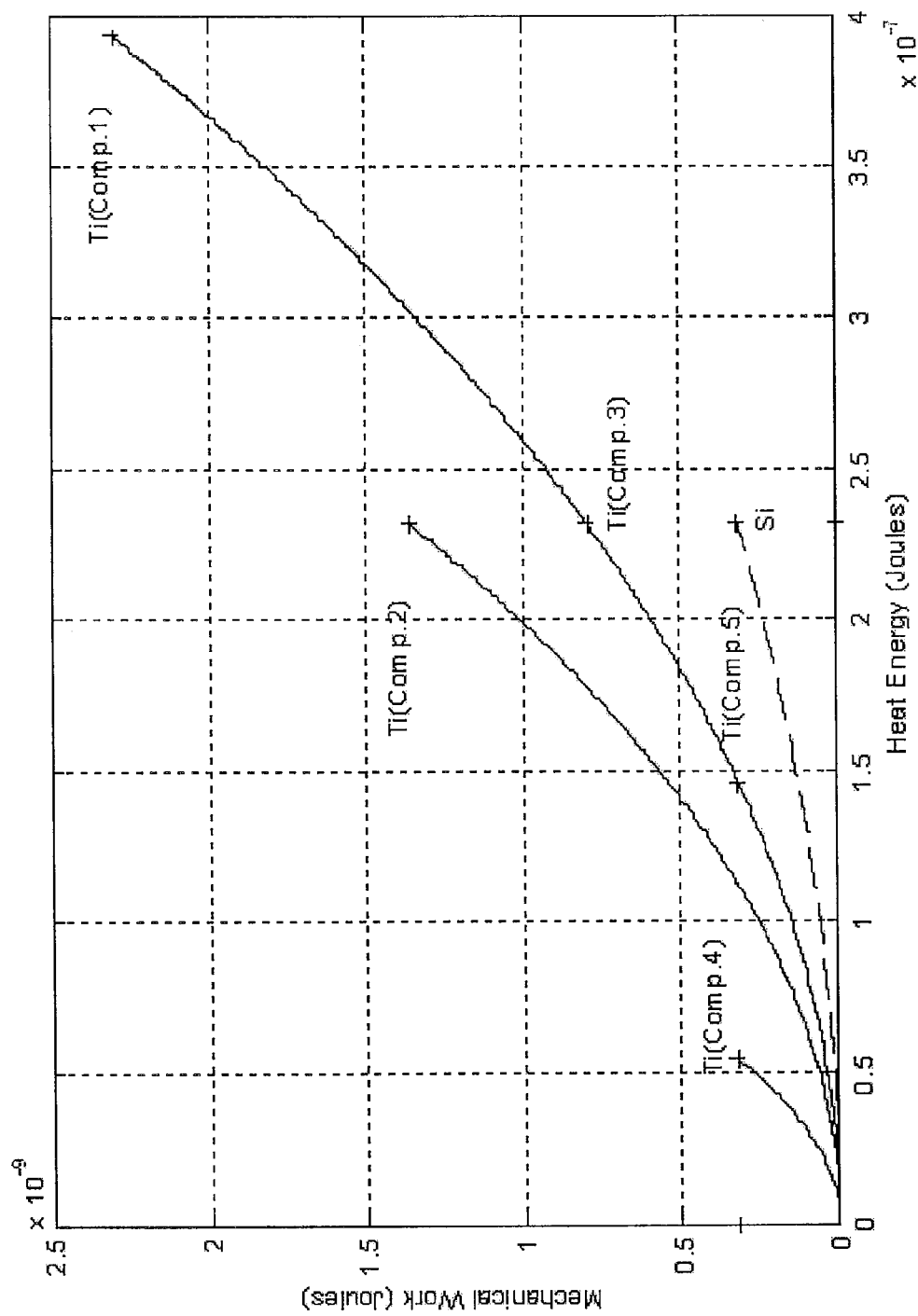
FIG. 4 shows a comparison of mechanical work versus the heat energy of thermoelastic actuator fabricated from Titanium and Silicon.

Two actuators constructed from titanium and silicon are compared using graphed energy results in FIG. 4. Five design comparisons for Titanium are plotted according to the results contained in Table 3. The relationship between volumes, mechanical work and heat energy are identical to those included in Table 3. Titanium volumes are scaled using length for Comparisons 2 and 4.

Discussion

The combination of five separate material properties is important in assessing a material's potential for thermoelastic design and materials with one predominant property have been shown to not necessarily be the best candidate. This is evident in both Table 3 for PTFE (high g) and diamond (high E). Both gold and copper have high g values but are hindered as good candidates by low E and high r values. Silicon is very inefficient compared to certain other materials, however, amorphous silicon dioxide is possibly the most inefficient material of all.

Output mechanical work, input heat energy and actuator volume are three essential characterizing parameters for thermoelastic design. The design method described incorporates these parameters using only material properties and provides a structured approach for material selection. The method is versatile because the approach assesses the potential of a material using easily calculated comparison ratios. It is important to note that the approach is a measure of a materials potential and must be used as a tool in conjunction with other appropriate design criteria. For example, criteria such as force/deflection characteristics of the output work, material resistivity, environmental ruggedness and material availability may be important. The operable temperature range is assumed to be from 0 degrees to the melting point on the Centigrade scale because it is indicative of the material thermal range. However, the maximum operable temperature could be different due to oxidation of the material or other thermal design constraints. Titanium nitride has close to the highest actuation efficiency value when melting point is used as a criteria. However, Titanium diSilicide is potentially a better candidate for use when oxidation temperature is used. Titanium nitride is a practical candidate because it is well established as a CMOS barrier material. The oxidation temperature of TiN can be raised from 500° C. to 900° C. by alloying with aluminum. The alloyed material has a symbol (Ti,Al)N.

The actuation efficiency of a simple thermoelastic titanium beam is low compared to other actuation mechanisms (less than 1 percent). It is theoretically possible to get a thermoelastic actuation efficiency of about 4.5 percent for a simple titanium nitride beam, however, this value typically decreases when the material is implemented in a MEMS device due to associated operational losses (for example—thermal conduction into the substrate).

The invention has been described herein by way of example only. Skilled workers in this field will readily recognize many variations and modifications which do depart from the spirit and scope of the broad inventive concept.

We claim:

1. A method for selecting a material for a thermal bend actuator of a printhead nozzlel, the method including the steps of:
    selecting the material from the group including silicides and carbides of titanium; borides, silicides, carbides and nitrides of tantalum, molybdenum, niobium, chromium, tungsten, vanadium, and zirconium; and
    selecting the material on the basis of $\epsilon$, wherein $\epsilon$ is a dimensionless constant for the material in accordance with the formula $$\varepsilon = \frac{E\gamma^2 T}{\rho C}$$

wherein E is Young's module of the material; $\gamma$ is the coefficient of thermal expansion; T is the maximum operating temperature, $\rho$ is the density and C is the specific heat capacity.

2. The method of claim 1, comprising the step of normalizing the dimensionless constant relative to that of silicon.

3. The method of claim 2, wherein said normalizing step comprises the steps of calculating the value of constant $\epsilon$ for the material at the maximum operating temperature and dividing the value by the value of constant $\epsilon$ obtained for silicon at that same temperature.

4. The method of claim 1, wherein the material is further selected on the basis of $m_\epsilon$, where $$m_\varepsilon = \frac{d\varepsilon}{dT} = \frac{E\gamma^2}{\rho C}\left[\frac{N/m^2 1/° C.^2}{kg/m^3 Nm/kg° C.}\right]$$

5. The method of claim 1, wherein the material is further selected on the basis that the material
    a resistivity between 0.1 μΩm to 10.0 μm.

* * * * *